United States Patent
Kirihata et al.

(10) Patent No.: US 6,178,126 B1
(45) Date of Patent: Jan. 23, 2001

(54) MEMORY AND SYSTEM CONFIGURATION FOR PROGRAMMING A REDUNDANCY ADDRESS IN AN ELECTRIC SYSTEM

(75) Inventors: Toshiaki Kirihata, Poughkeepsie; Paul W. Coteus, Yorktown Heights, both of NY (US); Warren E. Maule, Cedar Park, TX (US); Steven Tomashot, Williston, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/534,423

(22) Filed: Mar. 23, 2000

(51) Int. Cl.$^7$ ...................................... G11C 13/00
(52) U.S. Cl. ...................... 365/200; 365/230.05
(58) Field of Search ............... 365/189.05, 200, 365/230.05

(56) References Cited

U.S. PATENT DOCUMENTS 5,455,798 * 10/1995 McClure .............................. 365/200
5,764,574   6/1998 Nevill et al. .

OTHER PUBLICATIONS

Kirihata, et al. "Fault–Tolerant Designs for 256 Mb DRAM" IEEE Journal of Solid–State Circuits vol. 31, No. 4 Apr. 1996 pp. 558–566.

* cited by examiner

Primary Examiner—Terrell W. Fears
(74) Attorney, Agent, or Firm—H. Daniel Schnurmann

(57) ABSTRACT

A redundancy address in a plurality of memory devices is identified by at least two protocols available in an electric system. The first protocol is a mode register set command (or extended mode register set command). A chip select signal determines one of a plurality of memory modules, where a memory device is identified with at least one data port. Alternatively, a data strobe port or a data mask port may be preferably used for the selection of the memory devices instead of using the data port. The second protocol is a RAM access command which identifies a defective memory cell address (redundancy address) within the selected RAM by way of a plurality of address ports (ADRs). A redundancy address programming method is realized by way of electrically programmable fuses or by dynamically programmable redundancy latches integrated in each memory. The electric system configuration preferably includes a non-volatile storage device for storing a data port organization for the memory devices. Therein, the relation between the system memory data bus and the memory data ports for the memory devices are recognized by a memory controller. A microprocessor in the electric system is used for testing the memories and for analyzing the redundancy address. The present invention further includes a post device identification protocol to effectively debug field problems.

32 Claims, 12 Drawing Sheets

MEMORY AND SYSTEM CONFIGURATION FOR PROGRAMMING A REDUNDANCY ADDRESS IN AN ELECTRIC SYSTEM

RELATED ART

This application is related to U.S. patent application Ser. No. 09/512,922, entitled "Method of Addressing Electrical Fuses", filed Feb. 25, 2000.

BACKGROUND OF THE INVENTION

CMOS technology has evolved such that the computer market has rapidly opened to a wide range of consumers. Today, multi-media requires at least a 64 MB, and preferably even a 128 MB random access memory (RAM), which increases the relative cost of the memory system within the computer. In the near future, it is likely that 256 MB and 512 MB computers will become commonplace, which suggests a potential strong demand for 256 Mb RAMs and beyond. Still in the development stage, RAMs in the Gigabit range are already under way. As RAM density and lithographic difficulties increase, it is more difficult to obtain RAMs which are fully functional. Process and design engineers are continuously attempting to reduce and, ultimately, eliminate mask defects.

It has long been practiced in the art creating redundant circuits which can substitute failing circuits during a repair operation, wherein the process of repairing involves creating and/or destructing connections to the RAM. Most RAMs are organized as 2-dimensional arrays of rows and columns. Redundant circuits usually take the form of spare rows and columns and switchable connections known as fuses. An approach typically used for repairing a RAM is known as redundancy replacement, wherein a redundancy address for replacing a faulty element is identified at the device level and programmed by blowing laser fuses or electrically programmable fuses. Redundancy replacement with laser fuses is the most commonly used approach to improve memory device yield, the details of which are well described in the article, T. Kirihata et. al., "Fault-Tolerant Designs for 256 Mb DRAM," IEEE Solid-State Circuits, Vol. 31, No. 4, April 1996, pp. 558–556. An on-chip programming method and the detailed of the embodiment with the electrically programmable fuses are well discussed in U.S. patent application Ser. No. 09/512,922, entitled "Method of Addressing Electrical fuses".

Typical electric systems, such as personal computers, employ a plurality of RAMs to embody a main memory of adequate density (i.e., 128 MB) coupled to data ports (i.e., 64 bits). More particularly, the main memory is configured by arranging a plurality of Dual-In line-Memory-Modules (DIMM), each consisting of a plurality of RAMs. When the RAMs are arranged in a DIMM configuration, programming a redundancy address in at least two of the memory devices is required to perform a repair at the DIMM or at system level.

FIG. 1 shows a simplified version of a standard DIMM (100). The DIMM ports consist of a clock port (CLK), control ports ($\overline{CS}$, $\overline{RAS}$, $\overline{CAS}$, $\overline{WE}$), address ports (ADRs), and 64 data ports (DQ<0:63>) coupled to a system memory bus. Eight RAMs (RAM 0–7), each having 8 RAM data ports (i.e., DQ<0:7> for RAM0) are arranged within DIMM (100), wherein the clock (CLK), address bus (a plurality of address lines ADRs), and control bus ($\overline{CS}$, $\overline{RAS}$, $\overline{CAS}$, $\overline{WE}$) of all the RAMs 0–7 are interconnected and coupled to the corresponding DIMM ports. DQ<0:63> are preferably arranged in 8 DQ groups, each having 8 data ports coupled to appropriate RAM data ports in the corresponding RAMs. More particularly, DQ<0:7>, DQ<8:15>, DQ<16:23>, DQ<24:31>, DQ<32:39>, DQ<40:47>, DQ<48:55>, and DQ<56:63> are coupled to RAM0, RAM1, RAM2, RAM3, RAM4, RAM5, RAM6, and RAM7, respectively. In a typical electric system, a memory controller regulates the common control buses ($\overline{CS}$, $\overline{RAS}$, $\overline{CAS}$, $\overline{WE}$) and address buses (ADRs) such that a 64 bit data communication between all RAMs in the DIMM and the memory controller is realized by way of the system memory data bus (DQ<0:63>). Thus, all the memories in the DIMM are accessed (either read from or written to) in parallel with the common control and address bus.

In order to repair a fault in a plurality of RAMs within a plurality of DIMMs in an electric system, it is necessary to identify one DIMM of the plurality of DIMMs, the pertinent RAMs within the identified DIMM, and a redundancy address within the identified RAM. By way of example, U.S. Pat. No. 5,764,574 proposes the use of a RAM data port for programming a redundancy address within the RAM. The data ports of the RAMs in the DIMM are not coupled to the same DIMM data ports. This allows a redundancy address in each RAM to be programmed independently through the corresponding DIMM data ports. However, in an actual electric system, there exists a variety of RAMs which contain a different number of the data ports. It is highly unlikely to have a similar redundancy architecture which is applicable to all RAM configurations. These considerations cause a potential difficulty when using the prior art. Moreover, it is undesirable to enforce using a redundancy address programming protocol without considering the system standard protocol, particularly since it is very important to follow existing electric standards. The most important issue is to follow a fully compatible protocol for addressing the memory cells and programming a redundancy address. This is because the redundancy address to be programmed is the address which is inoperative when the protocol is applied. Until now, this problem was not fully considered. Therefore, today, when a RAM fails in the field, (i.e., installed in an electric system), at least one DIMM having the defective RAM or all of the RAMs must be replaced. Solving this problem necessitates introducing new techniques that guarantee the repair of RAMs within a DIMM or electric system notwithstanding the added complexity to the design and manufacture.

OBJECTS OF THE INVENTION

Accordingly, it is an object of the invention to provide a method of identifying and programming a redundancy address in a plurality of RAMs arranged in a dual-in line-memory- module (DIMM) configuration or within a plurality of DIMMs forming an electric system to perform a repair at system level that guarantees full functionality of the DIMM and of the electric system.

It is another object of the invention to have a memory controller identify the memory data port organization and specific system information within each RAM, whether it is arranged in a DIMM or in an electric system, after that the system has been fully configured.

It is a further object of the invention to provide a protocol to perform a field repair of RAMs arranged in a memory module or within an electric system.

It is yet another object of the invention to use an existing protocol with a minimal modification to generate a field repair of RAMs arranged in a memory module or an electric system.

It is still a further object of the invention to use a microprocessor for testing a plurality of RAMs in an electric system, analyze the redundancy addresses, and program a redundancy address to effect a field repair.

It is yet a further object of the invention to provide a method to store an electric system information into a RAM arranged in the electric system, the information of which can be read out after the RAM is disassembled for a field problem analysis.

SUMMARY OF THE INVENTION

In one aspect of the invention, there is provided a plurality of RAMs, each consisting of a plurality of memory cells arranged in a matrix. The RAMs are preferably arranged in a plurality of dual-in line-memory modules (DIMMs) within an electric system, wherein a defective memory cell address (redundancy address) in any RAMs can be identified, while following existing RAM standard protocols with minimal modifications. More particularly, a defective memory cell within a plurality of RAMs in a plurality of DIMMs is identified by at least two protocols available in the electric system. The first protocol is a mode register set command (or extended mode register set command) which selects a DIMM by way of a chip select signal ($\overline{CS}$) and designates a RAM by way of at least one data port (DQ). Alternatively, a data strobe port (DQS) or a data mask port (DQM) may preferably be used for selecting the RAM instead of using the DQ data port. The second protocol is a RAM access command which identifies a defective memory cell address (redundancy address) within the selected RAM byway of a plurality of address ports (ADRs). A RAM activation command and a RAM read command are preferably used for row and column redundancy address programming, respectively, wherein the address vector applied to the address ports are the redundancy address. The identified defective memory cell is then replaced with a redundancy memory cell by programming the corresponding redundancy address with electrically programmable fuses (e-fuses). Alternatively, the redundancy address with redundancy address latches may be programmed by decoders or shift registers. The redundancy memory cells, e-fuses, or redundancy address latches may be integrated within the corresponding RAM or placed in any other similar devices. The method further includes a non-volatile storage device, such as a non-volatile random access memory (NVRAM) or electrically programmable fuses (e-fuses) which store the RAM data port information, such that the relation between the RAM data ports and the DIMM data ports can be recognized by the memory controller or by any other similar devices. Optionally, the RAM specific redundancy information (i.e., the domain and redundancy repairability) may also be stored in a non-volatile storage device, offering a more flexible redundancy programming for repairing and eliminating defects at the system level. Additionally, the NVRAM or e-fuses in each RAM may also be included in order to be programmed and read out for post-RAM identification. The method may further include a microprocessor which tests the RAMs, analyzes a redundancy address, and programs the redundancy address in the RAMs through the corresponding data port.

BRIEF DESCRIPTION OF THE DRAWINGS

Other aspects, features and advantages of the present invention will become apparent from the following detailed description of preferred embodiments, when read in conjunction with the accompanying drawings.

DETAILED DESCRIPTION OF THE INVENTION

Figure 1:
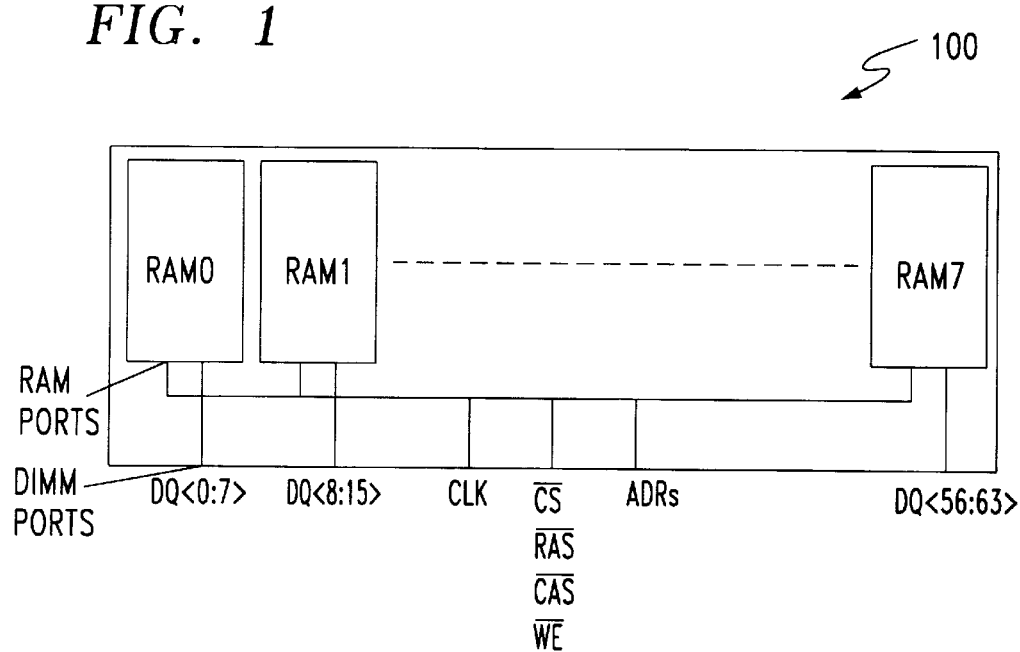
FIG. 1 is a diagram illustrating a typical dual-in line-memory-module (DIMM) consisting of eight random access memories (RAM 0–7).
Figure 2:
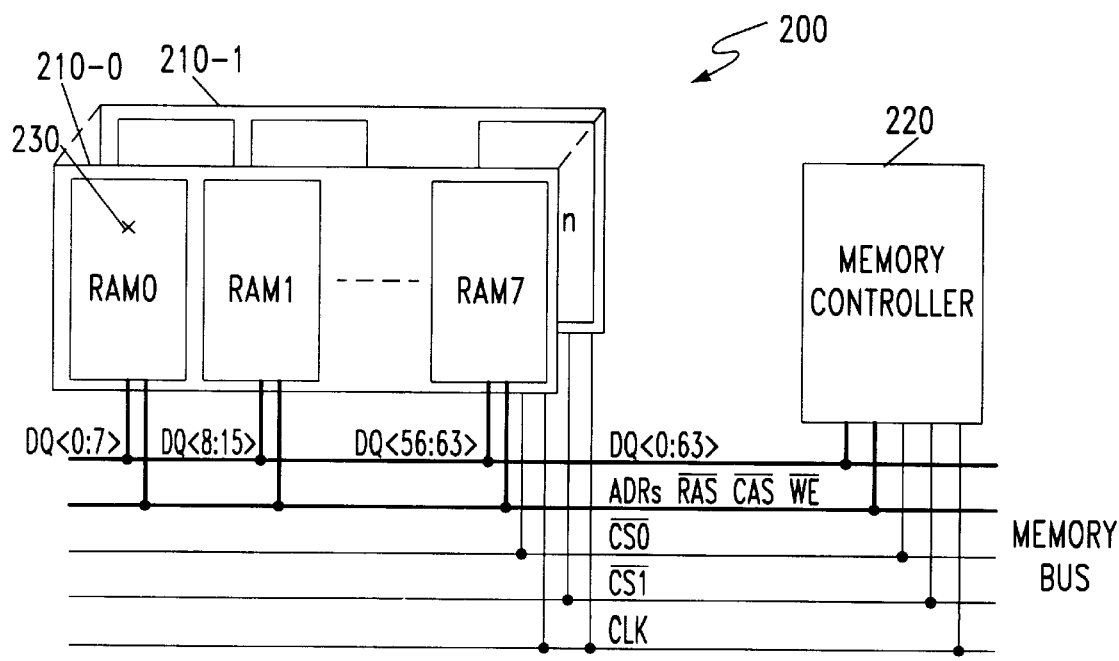
FIG. 2 is a diagram illustrating a typical electric system consisting of two DIMMs, each consisting of RAM 0–7 and a memory controller.

FIG. 2 shows a typical electric system (200) consisting of two DIMMs (210-0 and 210-1). Each DIMM consists of eight random access memories (RAM0–7). The sixteen RAMs distributed between the two DIMMs are used as the main memory of the electric system (200). The following discussion assumes a system suitable for single data rate synchronous dynamic random access memories (SDR SDRAMs) acting as RAMs. It also assumes that the SDR SDRAMs are programmed for single bit burst mode with a $\overline{CAS}$ latency of 2, determined by the mode register set command. It is further assumed that the SDRAMs are automatically pre-charged after a memory write or read access operation (i.e., when an auto pre-charge command is enabled). The details of the mode register set command and of the auto pre-charge command for SDR SDRAM are well known in the art and may be found in any SDR SDRAM specification document. Therefore, they will not be discussed further.

While a memory data access operation is taking place within the electric system (200), a memory controller (220)

regulates the data communication by way of 64 bit system memory data buses (DQ<0:63>) linking the RAMs to the memory controller (220) or to any other similar devices, such as cache memory. The memory controller (220) may be integrated in a microprocessor. More particularly, the memory controller (220) manages the chip select signals ($\overline{CS0}$ 0-1), the row address strobe signal ($\overline{RAS}$), the column address strobe signal ($\overline{CAS}$), the write enable signal ($\overline{WE}$), and a plurality of address buses (ADRs), all of which are synchronized at the leading edge of clock (CLK). The control signals, such as the clock enable signal (CKE), data mask signals (DQM), data strobe signal (DQS) (not shown), bank address buses have been eliminated for the sake of simplicity. The data strobe, although not used in a standard single data rate memory, is used in a standard double data rate memory to assist in the capture of data by the RAM or the memory controller and are applicable to both SDR and DDR memory, as well as other memory types such as Rambus, Synclink, etc., all of which are known in the prior art. Since the data strobe is described in SDRAM-DDR specification documents, it will not be discussed herein. Signals $\overline{CS0}$ and $\overline{CS1}$ are assigned to DIMM (210-0) and DIMM (210-1), respectively. Note also that the signals $\overline{RAS}$, $\overline{CAS}$, $\overline{WE}$, and ADRs are all interconnected to each other, both in the DIMMs and in all RAMs. Two DIMMs (210-0 and 210-1) share the system memory data bus DQ<0:63>. However, RAM 0–7 within DIMM are not coupled to the same system memory data bus and are uniquely assigned to a corresponding system memory data bus (i.e., RAM0 coupled to DQ<0:7>).

Figure 3:
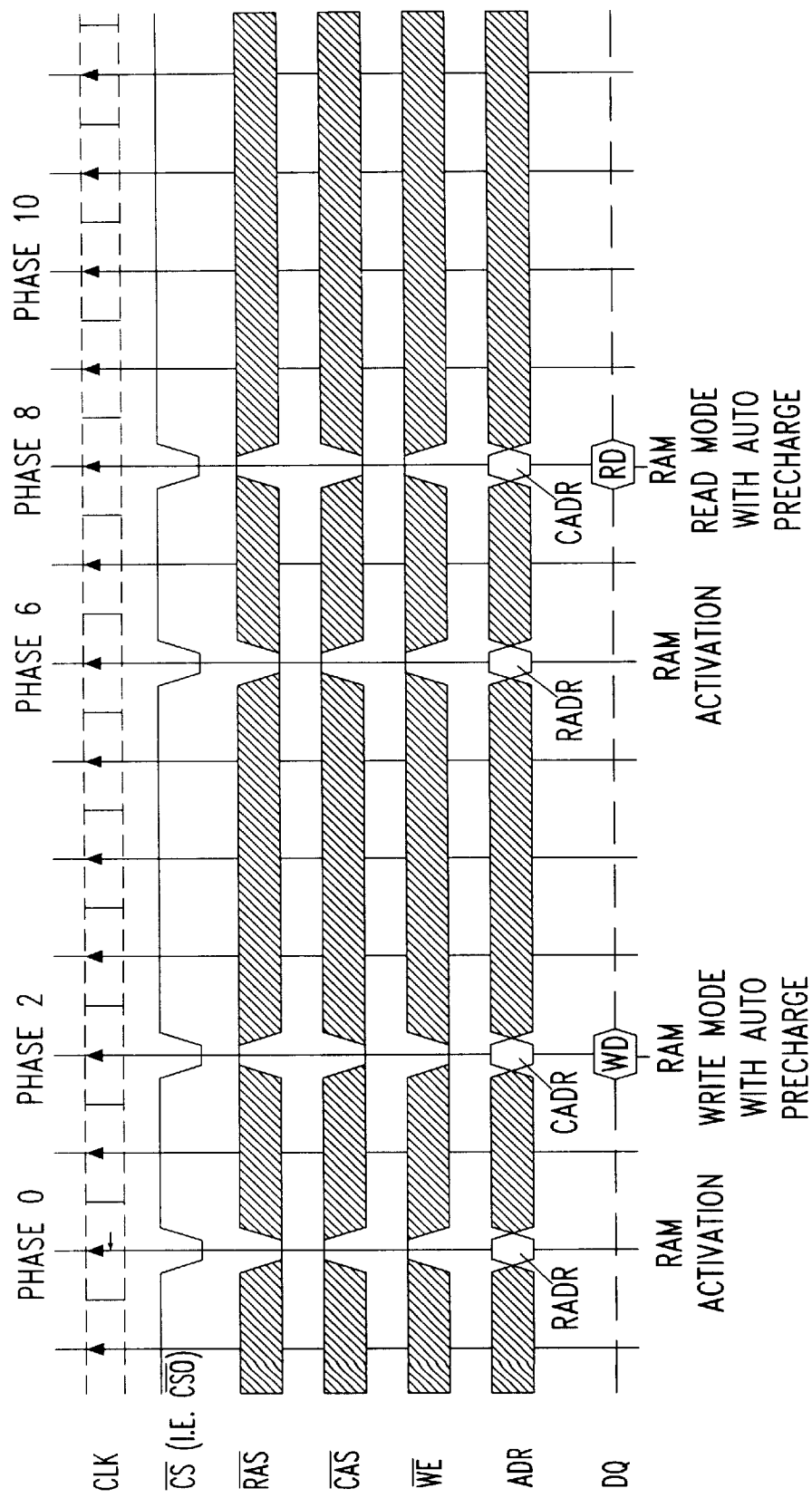
FIG. 3 is a timing diagram illustrating a typical SDR SDRAM access protocol.

FIG. 3 shows a timing diagram exhibiting a standard memory access protocol for RAM 0–7 within the DIMM (e.g., 210-0). A memory controller (220) ensures that $\overline{CS}$ (i.e., $\overline{CS0}$), $\overline{RAS}$, $\overline{CAS}$, and $\overline{WE}$ are at low, low, high, and high, respectively, at the leading edge of clock CLK (Phase 0). (RAM activation command). The memory controller (220) also generates a row address (RADR) in the address buses (ADRs) at the same leading edge of clock CLK (Phase 0). As explained in the Background of the Invention, all RAM0–7 in the DIMM (i.e., 210-0) selected by $\overline{CS}$ (i.e., $\overline{CS0}$) are simultaneously enabled. The corresponding memory cells within each RAM0–7 are selected by the row address (RADR) in the ADRs. For a memory write operation applicable to the RAM 0–7 within the DIMM (e.g, 210-0), a memory controller (220) determines that $\overline{CS}$ (i.e., $\overline{CS0}$), $\overline{RAS}$, $\overline{CAS}$, and $\overline{WE}$ are at low, high, low, and low, respectively at the leading edge of clock CLK (Phase 2) (RAM write command). The memory controller (220) also generates a column address (CADR) in a plurality of address buses (ADRs) at the same leading edge of CLK (Phase 2). Furthermore, RAM0–7 receive data (WD) on DQ<0:63> at the same leading edge of CLK (Phase 2). RAM 0–7 are then automatically pre-charged or deactivated (Auto pre-charge command). The memory controllers (220) secure that $\overline{CS}$ (i.e, $\overline{CS0}$), $\overline{RAS}$, $\overline{CAS}$, and $\overline{WE}$ are at low, low, high, and high, respectively at the leading CLK edge (Pase 6). The memory controller (220) also generates a row address (RADR) on the ADRs. This simultaneously activates all the RAM0–7 in the selected DIMM (e.g., 210-0) (RAM activation). This operation may not be necessary if the auto pre-charge command has not been enabled since RAM0–7 in the DIMM (e.g., 210-0) was already activated by a previous write operation (Phases 0 and 2). For a memory read operation, the memory controller (220) ensures that $\overline{CS}$ (i.e, $\overline{CS0}$), $\overline{RAS}$, $\overline{CAS}$, and $\overline{WE}$ are at low, high, low, and high, respectively. Memory controller (220) also generates a column address (CADR) in the ADRs at the leading edge of CLK (Pase 8) (RAM read command). RAM0–7 outputs data (RD) on DQ<0:63> following two clock cycles of the RAM read command (Phase 10, $\overline{CAS}$ latency of 2). Similar to the memory write mode operation, RAM0–7 are automatically pre-charged or deactivated (Auto pre-charge operation). The memory write and read access operations of RAM0–7 in the DIMM (210-0) and of RAM0–7 in DIMM (210-1) are determined by selecting $\overline{CS0}$ and $\overline{CS1}$, respectively.

In an actual electric system, memory controller (220) supervises the RAM activation command, RAM write command, and RAM read command, according to a request from the Operating System or from any application software. However, as oftentimes is the case, a memory cell in a RAM may become defective after the DIMM or the system was already configured. The new failure on the RAM may be due to an insufficient margin in the RAM, to additional process steps required for configuring the DIMM, or to unexpected noise in the electric system. The cell may become defective during manufacturing or even in the field after using the electric system for any length of time. When this happens, the existing electric system replaces the DIMM consisting of a plurality of RAMs or all of the RAMs within the electric system, even if only one defective cell is found, clearly a highly inefficient setup. Furthermore, since the RAMs (i.e., RAM0) within the DIMM configuration (210-0 and 210-1) share the same data bus, a RAM identification with only one data port is not possible. This problem is not believed to have been discussed in the prior art. It is precisely because of this reason that no practical redundancy addressing and programming methods applicable to an entire electric system have been considered in the past. The present invention uses standard protocols (i.e., mode register set command, RAM activation command, RAM read command, RAM write command) to program a redundancy address in the electric system which is comprised of a plurality of DIMMs, making system level reliability a realistic possibility.

Figure 4:
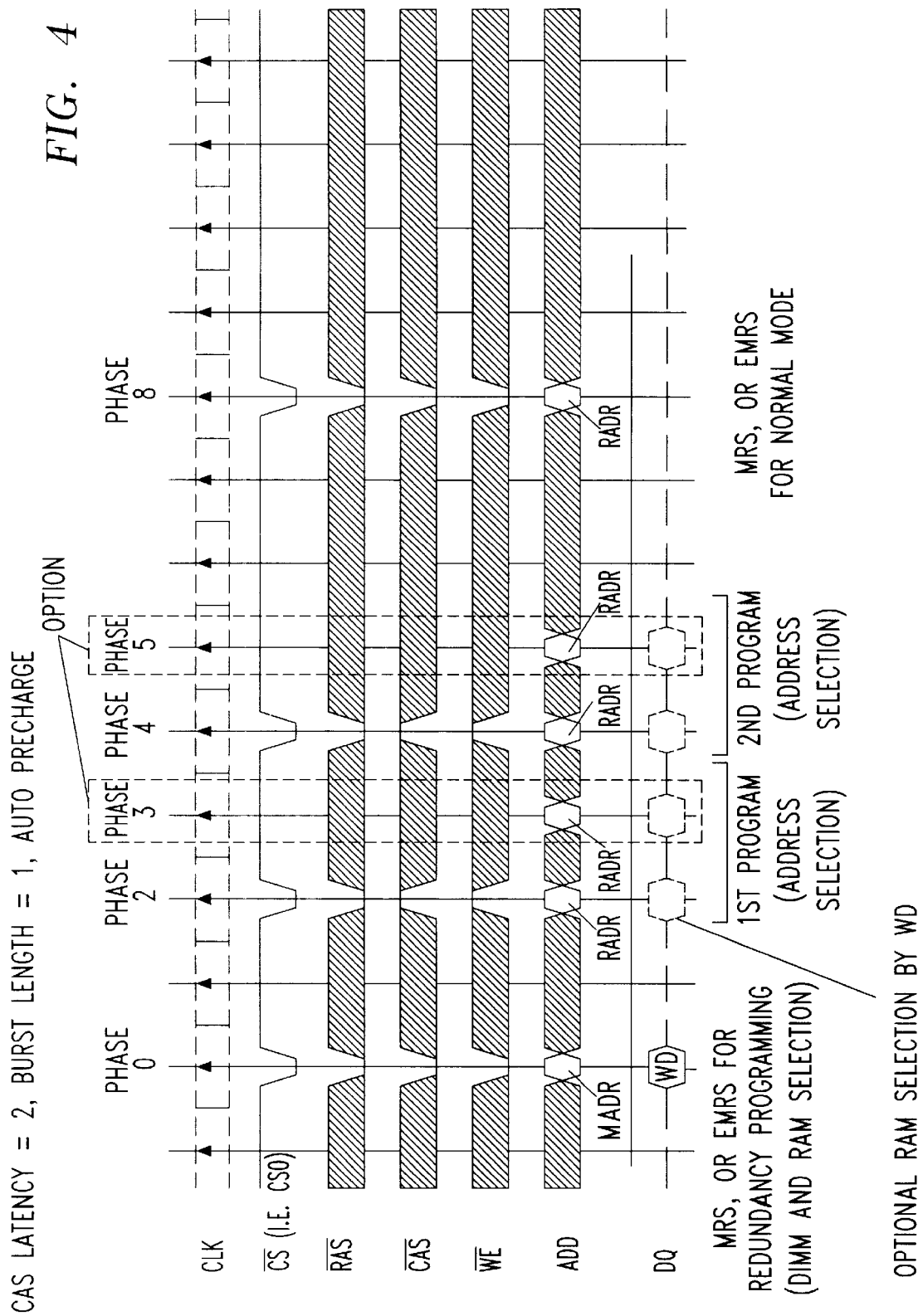
FIG. 4 is a timing diagram illustrating a redundancy address programming protocol in an electric system.

FIG. 4 is a timing diagram showing a protocol for programming a row redundancy address in the RAM of a typical electric system (as seen, for instance, in FIG. 2). However, this redundancy addressing method is also applicable to any redundancy address programming suitable to any RAM within any DIMM within the electric system.

Figure 5:
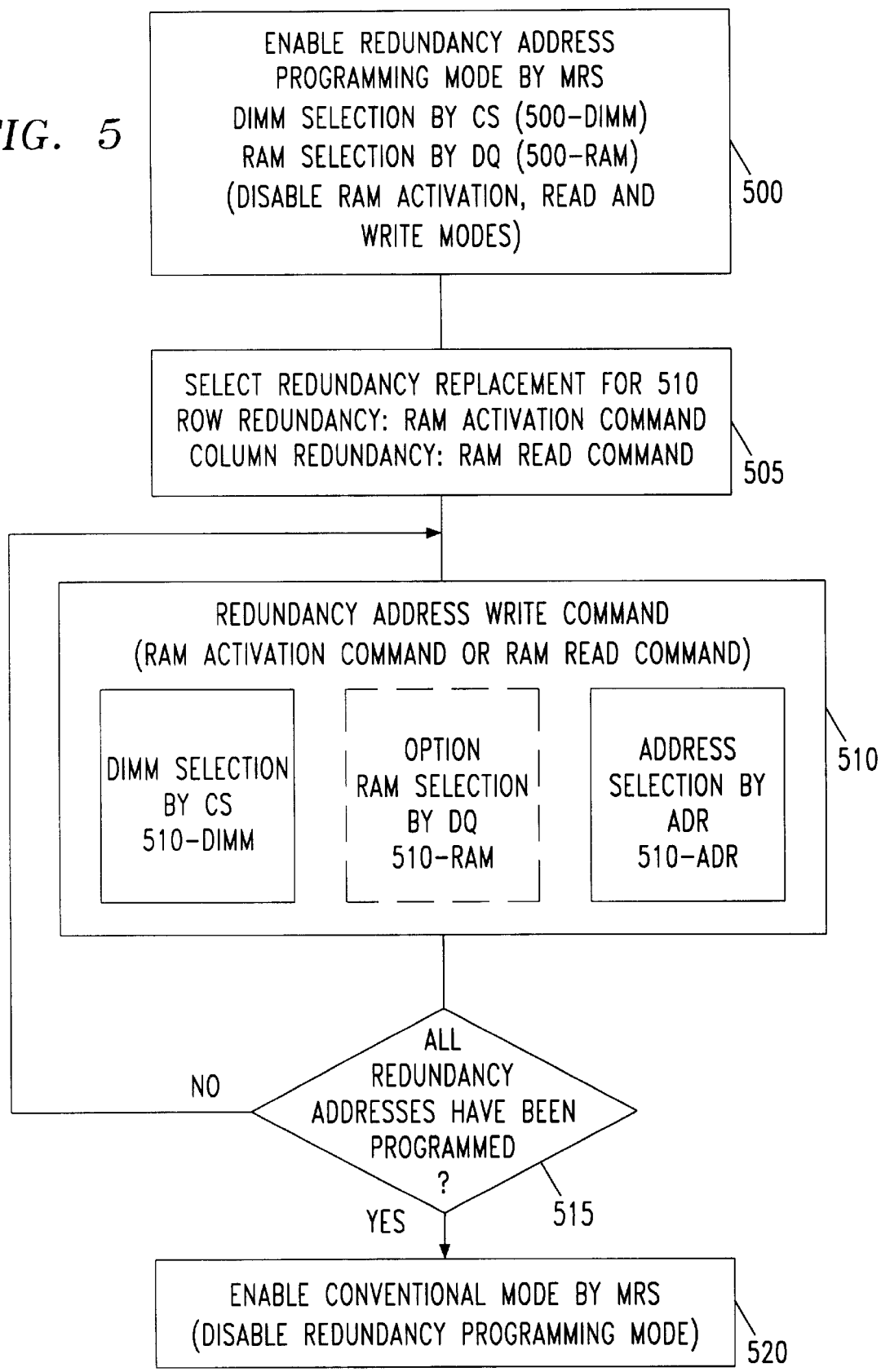
FIG. 5 is a flow chart used for programming a redundancy address within the electric system.

FIG. 5 shows a flow chart summarizing the addressing method. The memory controller (220) regulates the mode register set command (MRS) or the extended mode register set command (EMRS) to enable a row redundancy programming mode (flow 500) wherein signal $\overline{CS}$ (i.e., $\overline{CS0}$), $\overline{RAS}$, $\overline{CAS}$, $\overline{WE}$ are all at low. MRS and EMRS, where $\overline{CS}$ (i.e., $\overline{CS0}$) allows a DIMM selection (500-DIMM), selects one of the plurality of DIMMs, overcoming a problem in the prior art. The redundancy programming mode (flow 500) is enabled when the input condition of the input signal (WD) on the data port is valid. RAM0–7 on the selected DIMM is identified by way of DQ<0:63> at the leading edge of CLK (Phase 0), wherein DQ<0>, DQ<8>, DQ<16>, DQ<24>, DQ<32>, DQ<40>, DQ<48>, and DQ<56> select RAM0, RAM1 RAM2, RAM3, RAM4, RAM5, RAM6, and RAM7, respectively. RAM0 is selected by holding DQ<0> in the high state, while holding all others in the low state (selection 500-RAM). Optionally, the phase that detects the data port condition can have a latency from the corresponding MRS or EMRS command. Alternatively, instead of using the data ports, a data strobe port or a data mask ports may be used to enable the MRS or EMRS. This allows a redundancy programming mode to be enabled in the specific RAM. Additionally, a predetermined address (MADR) in the ADRs must be applied of at the leading edge of CLK (Phase 0), which is a well known standard protocol for MRS or EMRS, and which will not be discussed. Optionally, at least one ADR port or any other port may select a redundancy replacement, either a row or a column redundancy replacement or a variable bit redundancy replacement (500-replacement). The objective of the present invention is to detect an input signal condition of the data port at which MRS or EMRS is given. The present invention uses a data port to select a RAM when MRS or EMRS are applied. This introduces minimal modifications to the electric system. The redundancy address is identified by a fully compatible standard protocol with address ports. RAM activation command and RAM write command are preferably used for row redundancy address programming and column redundancy address programming, respectively. The following example shows a details for row redundancy address programming Memory controller (220) determines that $\overline{CS}$ (i.e., $\overline{CS0}$), $\overline{RAS}$, $\overline{CAS}$, and $\overline{WE}$ are at low, low, high, and high, respectively, at the leading edge of the clock CLK (Phase 2). (RAM row redundancy address write command). Note that this command protocol is fully compatible with the RAM activation command (flow 510), but its function differs once a redundancy programming MRS or EMRS has been enabled (flow 500). A fully compatible command between a bank activation command and a row redundancy address write command significantly simplifies the electric system design because this address is the failing row address, or bank activation address, which must be replaced by a redundancy row to repair the RAM. A row redundancy address is programmed by applying the same protocol with the same row addressing. Optionally, the RAM selection may be enabled with input signals on the data ports at which the row redundancy address write command is given (phase 2). For programming a column redundancy, a RAM read command is preferably used, because this address is the failing column address or read address, which must be replaced by a redundancy column to repair the RAM. Alternatively, any RAM command (a RAM activation, a RAM write command, or a RAM read command) may be used for enabling a redundancy replacement, where predetermined address bits can select a row redundancy replacement, a column redundancy replacement, or any other replacement.

In the present example, RAM0–7 in DIMM (e.g., 210-0) is designated (selection 510-DIMM), since $\overline{CS}$ (i.e., $\overline{CS0}$) is at low during the RAM activation command. If the DIMM selection (510-DIMM) differs from the DIMM selection (500-DIMM), the RAM enables a conventional RAM activation mode. This allows a redundancy address programming for the RAMs in one DIMM while allowing a normal RAM access mode for the RAMs in another DIMMs. The row redundancy address within the designated RAM0 in the selected DIMM (e.g., 210-0) is identified by the address vector (ADRs) in a RAM activation command (Phase 2). Optionally, the redundancy address of either ADRs may be sequentially applied during several phases. For example, the lower row redundancy address bits are supplied at the leading CLK edge (phase 2) and the remaining row redundancy address bits are provided on the following CLK edge (Phase 3). In conclusion, a row redundancy address in RAM0 within the DIMM (210-0) is successfully identified, while maintaining the standard RAM protocol with minimal modifications.

The next step is determined by flow (515). If an additional redundancy address bit were to be programmed, flow (510) is repeated. If all redundancy addresses have been programmed, the redundancy programming mode is disabled by enabling another MRS or EMRS command (flow 520). The following section discusses the details of a RAM design for a row redundancy address programming and replacement.

Figure 6:
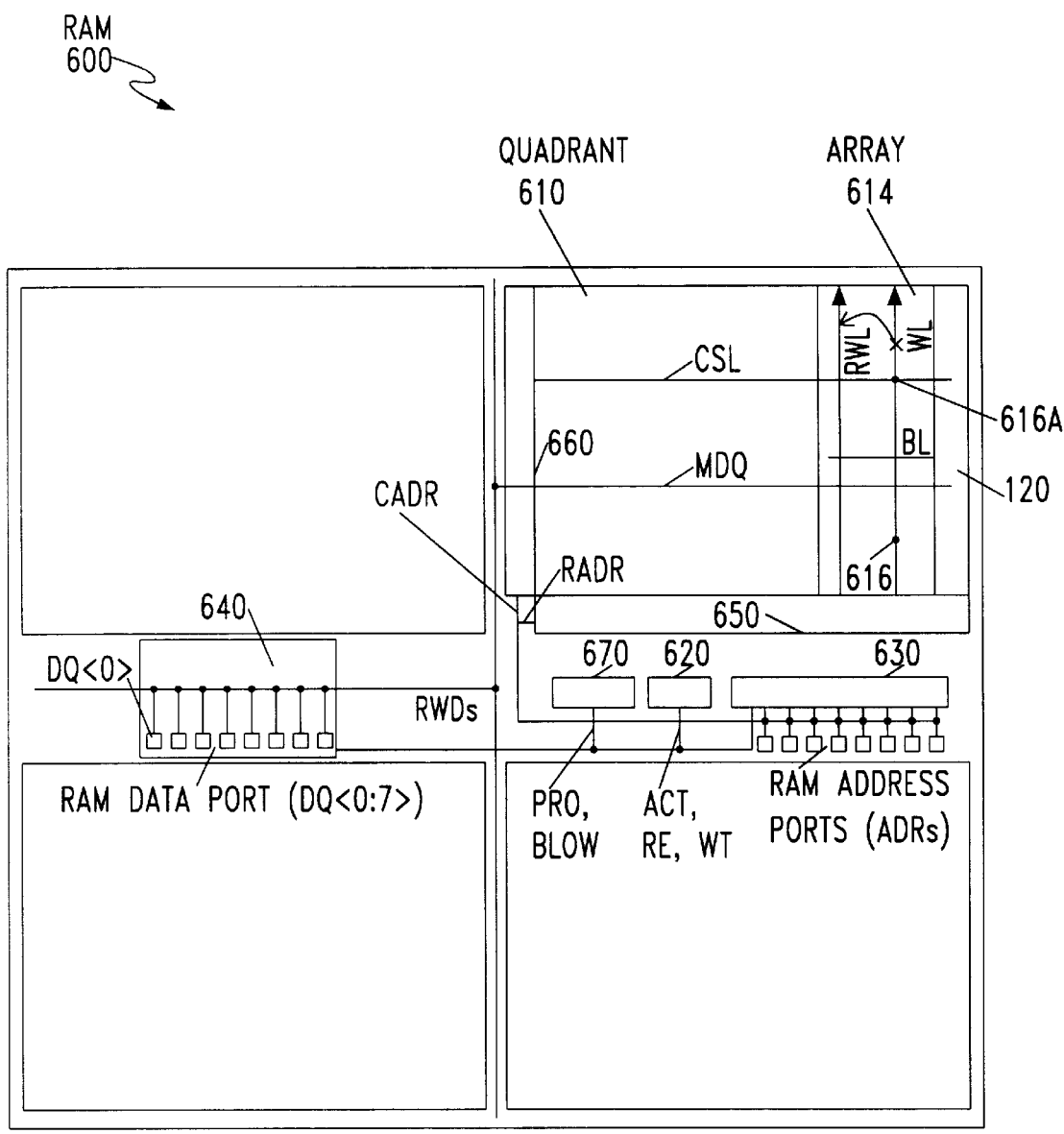
FIG. 6 shows a RAM architecture operating in a redundancy address programming mode, in accordance with the present invention.

FIG. 6 shows a RAM (600) configured in 4 quadrants (610). Each quadrant (610) is subdivided into a plurality of arrays (614), each consisting of a plurality of memory cells (616) arranged in a matrix. The memory cells (616) are coupled to corresponding wordlines (WLs) and bitlines (BLs). The RAM array configuration is well known and will not be addressed hereinafter. As discussed previously in FIG. 3, for a memory access operation, specific $\overline{CS}$, $\overline{RAS}$, $\overline{CAS}$, $\overline{WE}$ conditions are applied to the corresponding ports of the RAM (600). It is assumed that the on-chip signals (ACT, RE, WT, PRO, BLOW) are active high signals. The RAM activation command ($\overline{CS}$ low, $\overline{RAS}$ low, $\overline{CAS}$ high, and $\overline{WE}$ high) is detected by command decoder (620), forcing signal ACT switch periodically to high (i.e., pulsed ACT). The pulsed ACT signal allows an address received by the address ports (ADRs 630) to be transferred to the on-chip row address bus (RADRs) where they become latched. The RADRs are decoded by row decoder (650). This activates the corresponding WL. The memory cells (616) coupled to the activated WL are actuated and sensed.

For a RAM write mode operation, the RAM write command ($\overline{CS}$ low, $\overline{RAS}$ high, $\overline{CAS}$ low, and $\overline{WE}$ low) is detected by command decoder (620) which forces signal WT to switch periodically to high (pulsed WT). The pulsed signal WT allows an address received by the address port (ADRs 630) to be transferred to the on-chip column address bus (CADRs) where it is latched. The pulsed signal WT also enables RAM data ports (DQ<0:7>640) to receive data (WD) from the corresponding system memory data ports (i.e. DQ<0:7> for RAM0). The data received is transferred to the memory array (614) by way of on-chip data bus (RWDs) and the main DQ bus (MDQs). CADRs are decoded by column decoder (660), activating the corresponding column select line (CSL) and linking selected BLs to the MDQs. In this manner, data (WD) in the data ports (640) can be successfully written to the corresponding memory cells (616A).

For a memory read mode operation, the memory read command ($\overline{CS}$ low, $\overline{RAS}$ high, $\overline{CAS}$ low, and $\overline{WE}$ high) is detected by command decoder (620). This generates a pulsed signal RE. The pulsed signal RE transfers an address received by the address port (630) to the on-chip column address bus (CADRs) where it is latched. CADRs are decoded by column decoder (660), activating the corresponding column select line (CSL). This couples selected BLs to the MDQs. Data in the selected memory cell (616A) is transferred to the MDQs and then to the RWDs. The pulsed signal RE also enables data ports (640), outputting the memory cell data (RD) to the external data bus (i.e., DQ<0:7> for RAM0).

The following discussion assumes that a redundancy address was programmed by way of electrically programmable fuses to achieve a row redundancy replacement. Note that this embodiment is also applicable to a column redundancy, a variable redundancy, or to any other redundancy. As discussed previously in FIG. 5, a redundancy address programming mode is enabled by setting a mode register set command (MRS) or a extended mode register set command (EMRS). The MRS or EMRS for the redundancy address programming mode is detected by mode register set decoder (670) with a valid condition of the data port. The MRS or EMRS decoder (670) forces signal PRO switch to high. Signal PRO maintains it at high until another MRS or EMRS is enabled. When PRO is at high, memory array access operations such as a RAM activation, RAM write, and RAM read are internally inhibited (flow 500). The RAM activation command and RAM read command are preferably used for a row redundancy address programming and column redundancy programming, respectively (flow 505). The following example shows details of the non-anti fuse electrically programmable fuses. However, the present invention also applies to any electrically programmable fuse, including anti e-fuses with oxide breakdown.

Memory controller (220) ensures that $\overline{CS}$ (i.e., $\overline{CS0}$), $\overline{RAS}$, $\overline{CAS}$, and $\overline{WE}$ are at low, low, high, and high, respectively, at the leading edge of clock CLK (Phase 2). (RAM row redundancy address write command—flow 510). Note that the memory controller (220) already selected the DIMM and the RAM by a previous MRS command. (Optionally, the memory controller also forces the corresponding DQ (i.e, DQ<0> for RAM0) switch to high to select a RAM.) The command decoder (620) detects the combination of $\overline{CS}$ (i.e., $\overline{CS0}$), $\overline{RAS}$, $\overline{CAS}$, $\overline{WE}$. If they are at low, low, high, and high, respectively, signal BLOW switches to high. This allows a row redundancy address (RADR) in the ADR ports to be transferred to the corresponding on-chip row address bus (RADRs).

Figure 7:
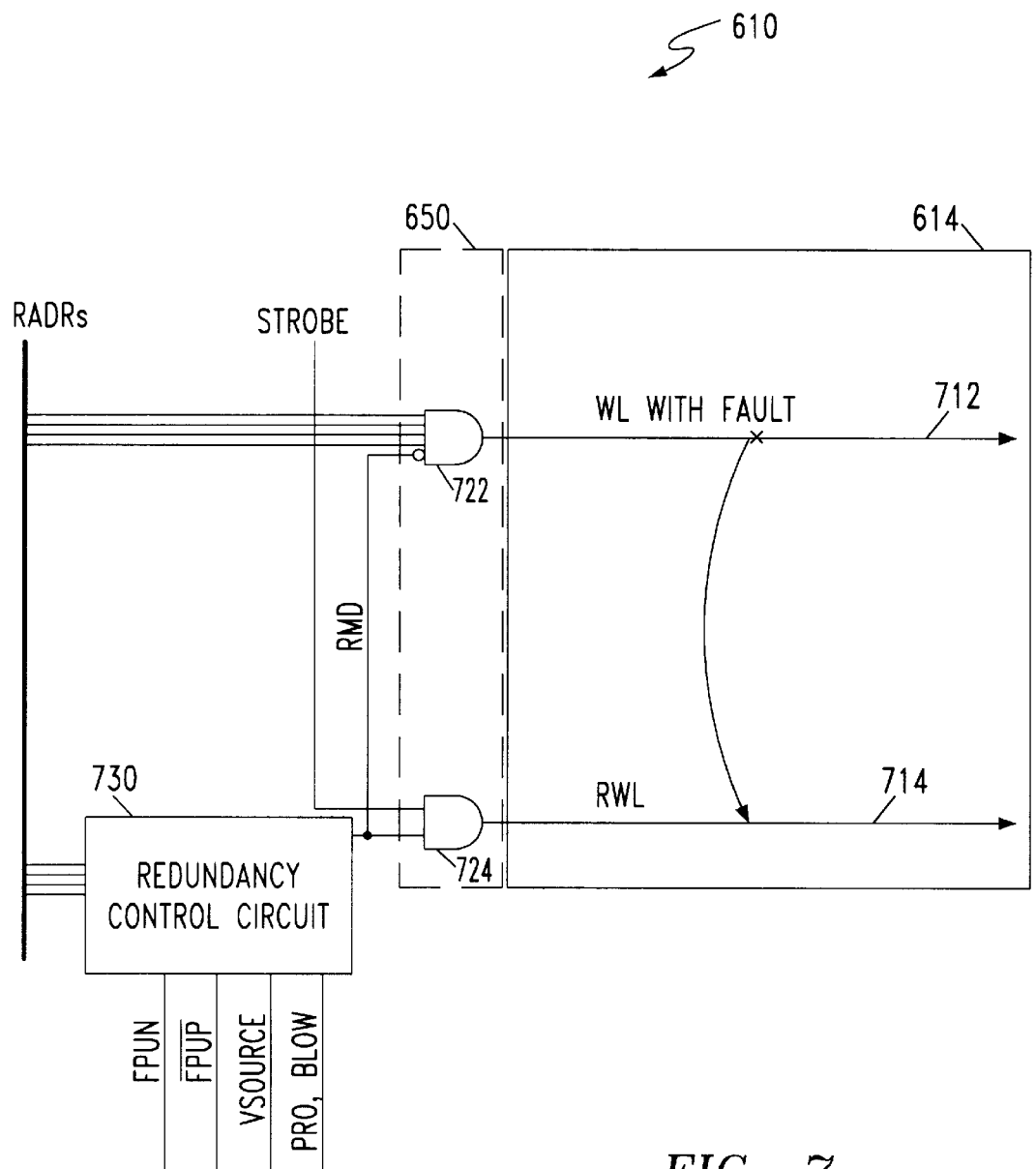
FIG. 7 is a detailed block diagram showing one quadrant of the RAM illustrated in FIG. 6.

FIG. 7 shows a detailed block diagram of arrays (614) positioned in the quadrant (610) shown in FIG. 6. Array (614) consists of a plurality of wordlines (WLs 712) and at least one redundancy wordline (RWL 714). They are controlled by a plurality of row decoders (722) and by a redundancy row decoder (724). The row decoders (722) translate the row address signals (RADRs) and activate the corresponding WL when STROBE switches to high. STROBE is generated by delaying signal ACT shown in FIG. 6. The redundancy row decoder (724) is controlled by a redundancy match detection result signal (RMD). The signal RMD is generated by redundancy control circuit (730). The redundancy control circuit (730) compares the RADR address with a preprogrammed redundancy address. Signal RMD switches to high when a match occurs. A RMD signal switching to high disables the row decoders (722) regardless of the RADR decoding result, inhibiting triggering the defective WL. On the other hand, the redundancy row decoder (724) activates RWL when STROBE switches to high.

Figure 8:
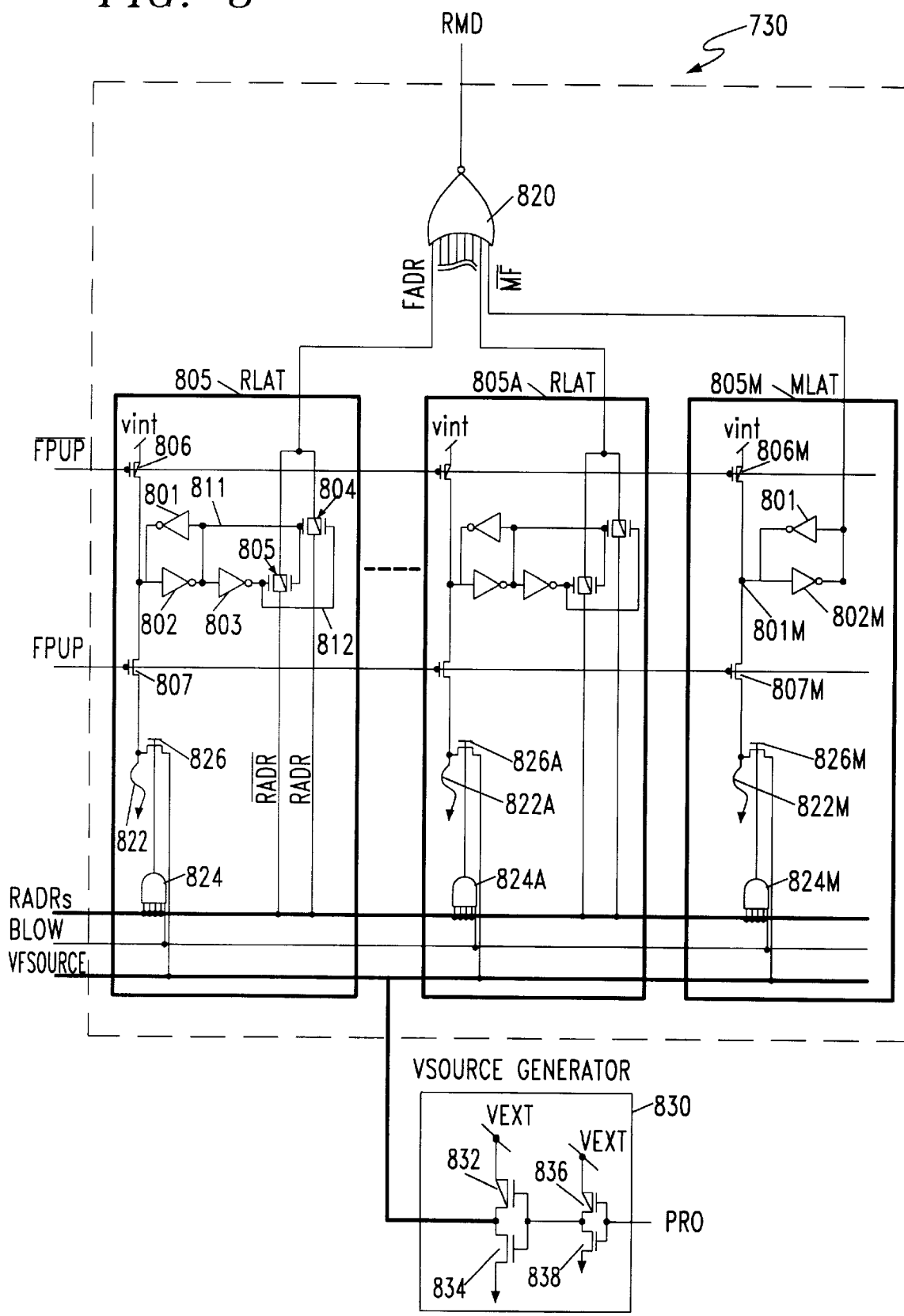
FIG. 8 is a first preferred embodiment of the invention showing a schematic diagram at the transistor level of a redundancy control circuit provided with e-fuses.
Figure 9:
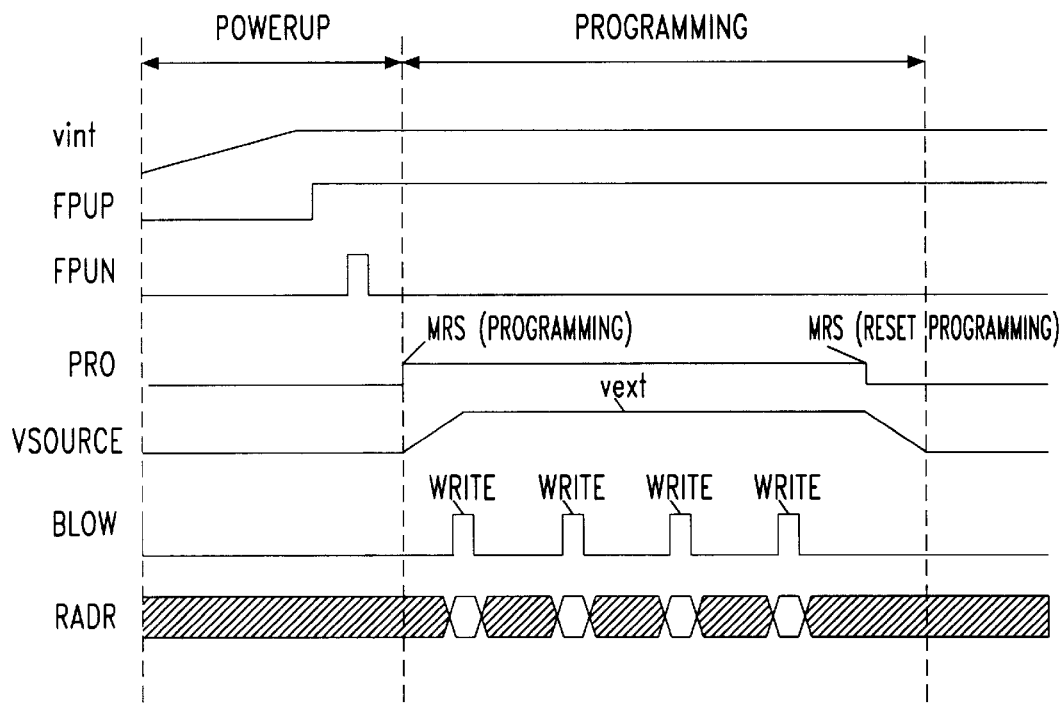
FIG. 9 is a timing diagram applicable to FIG. 8.

FIG. 8 is a first preferred embodiment of the invention showing a detailed schematic of the redundancy control circuit (730). FIG. 9 is a timing diagram applicable to FIG. 8.

The redundancy control circuit (730) consists of a plurality of redundancy address latches (RALTs 805), a master latch (MLAT: 805M), and a NOR gate (820). Additionally, a high voltage generator (VSOURCE generator 830) is required. VFSOURCE generator consists of NMOSs (834 and 838) and PMOSs (832 and 836) acting as a static voltage driver. VSOURCE generator may or may not be integrated in the redundancy control circuit (730).

Signal PRO switches to high when a redundancy address programming mode is enabled by MRS or EMRS while detecting the input condition of at least one data port (flow 500). This also enables VSOURCE generator (830). More particularly, PRO switching to high switches NMOS (838) and PMOS (832), coupling VSOURCE voltage to an unregulated external voltage source (Vext). All the logic except for the VSOURCE generator (830) use a regulated internal voltage (Vint). The Vext voltage used by the VSOURCE generator (830) is substantially greater than Vint, supplying current more effectively. The e-fuse address decoders (824) decipher the row address bus inputs (RADRs) and determine which e-fuse (822) is to be blown. The RAM row redundancy address write command (WRITE) allows the RADR bus to be controlled by a plurality of RAM address ports (ADRs) (flow 510). The address vector is known by the memory controller (220) as a defective address. Each address bit on the RADR controls the corresponding e-fuse (822). Additionally, higher RADR address bits are used for the selection of the redundancy control circuits (730), which is well known and which will not be discussed. Optionally, a pre-decoded address may be used for the signals on the RADR bus. The RAM redundancy address write command (WRITE) also generates a pulsed BLOW signal. When the pulsed signal BLOW switches to high, the identified e-fuse decoders (824) open the corresponding NMOS switches (826), blowing the address e-fuses (822). Optionally, each address bit can be sequentially programmed as a time multiplexing manner. By way of example, fuse decoder (824A) in RALT (805A) opens NMOS switch (826A). This allows a large current (I) to flow from the high voltage supply (VSOURCE) to ground through e-fuse (822-A). Power (P) applied to the e-fuse with resistance (R) is determined by $P=i^2 R$. If P is adequate at a certain spot of the e-fuse, the e-fuse conductivity is broken. The same process is repeated for blowing other e-fuses for programming other redundancy addresses (flow 515).

When the address e-fuses (822s) are programmed, a master e-fuse (822M) in a MLAT (805M) is also blown. The process for blowing the master e-fuse (822M) is same as the one used for blowing the address e-fuses in RLATs (805). Therefore, it will not be discussed further. When the master e-fuse is blown, master fuse output $\overline{MF}$ switches to low. This enables NOR gate (820). A fuse address signal (FADR), which is the output signal from RLAT (805), rises if RADR does not match the corresponding state of the address of the e-fuse. The output of NOR gate (820), i.e., redundancy match detection, results in signal RMD falling if at least one FADR shifts to high. This disables row redundancy decoder (724). Thus, no RWL is activated. If all FADRs are at low (redundancy address match condition), the signal RMD shifts to high. RMD switching to high disables the row decoders (722) regardless of the decoding results. On the other hand, the redundancy row decoder (724) activates RWL when STROBE switches to high. The detailed operation of the RLAT will now be described next.

A circuit RLAT acts as an address and fuse comparator. The CMOS latch consists of a pair of cross-inverters (801 and 802) providing complementary outputs (via inverter 803) to transfer gates 804 and 805. As shown in the timing diagram of FIG. 9, RLAT (805) is set during the RAM power-on phase. The RAM detects the transition of a regulated internal voltage source (Vint) to generate a PMOS fuse power-on signal ($\overline{FPUP}$), and an NMOS fuse power-up signal (FPUN). The signal $\overline{FPUP}$ remains at low until the voltage source (Vint) shifts to high, which naturally pre-charges node 810 to a high state by way of PMOS (806). The pre-charge operation of node 810 is completed when signal $\overline{FPUP}$ switches to high, where it is latched by the CMOS latch (inverters 801 and 802). The pulsed FPUN signal switches on periodically, changing the state of the CMOS latch (inverters 801 and 802), depending on the condition of e-fuse (822). If the e-fuse (822) is not blown, node 810 discharges to a low through NMOS (807), flipping the state of the CMOS latch (inverters 801 and 802). If the e-fuse is blown, the node (810) remains at high.

The row address bus (RADRs) consists of true and complement address bus lines (RADR and $\overline{\text{RADR}}$) pairing each address, which are then coupled to the corresponding RLAT (805). When the e-fuse is not blown ("0" state), nodes 810, 811, and 812 are at low, high, and low, respectively, opening transfer gate (804), and having FADR follow RADR. Alternatively, if the e-fuse is blown ("1" state) (i.e., when the transfer gate (805) is open), since nodes 810, 811, and 812 are at high, low, and high, respectively, then signal FADR follows $\overline{\text{RADR}}$. The preceding discussion presumed that a programmed address is "0" if the fuse is not blown, and a "1" if the fuse is blown. Signals RADR and $\overline{\text{RADR}}$ follow the RAM address port input (ADR) for each address bit. Table 1 shows the truth table showing the relation between the RAM address port (ADR), RADR, $\overline{\text{RADR}}$, the fuse state, and the output (FADR) of RLAT. The signal FADR, accordingly, rises when the signal ADR does not match the programmed e-fuse state (address and fuse unmatched detection).

Master latch (MLAT 805M) is similar to RLAT (805). However, it does not have two transfer gates (804 and 805) and an inverter (803) within RLAT(805). Similar to the redundancy address latch (RLAT) set operation, the node 810M is pre-charged to Vint by PMOS 806M. If master e-fuse (822M) is not blown, nodes 810M and $\overline{\text{MF}}$ shift to low and high, respectively, when NMOS (807M) is periodically switched on. If master e-fuse (822M) is blown, node 810M and $\overline{\text{MF}}$ remains at high and low, respectively. As long as the $\overline{\text{MF}}$ is at high (i.e., master e-fuse (822M) is not blown), NOR gate (820) is disabled, keeping signal RMD at a low level.

Figure 10:
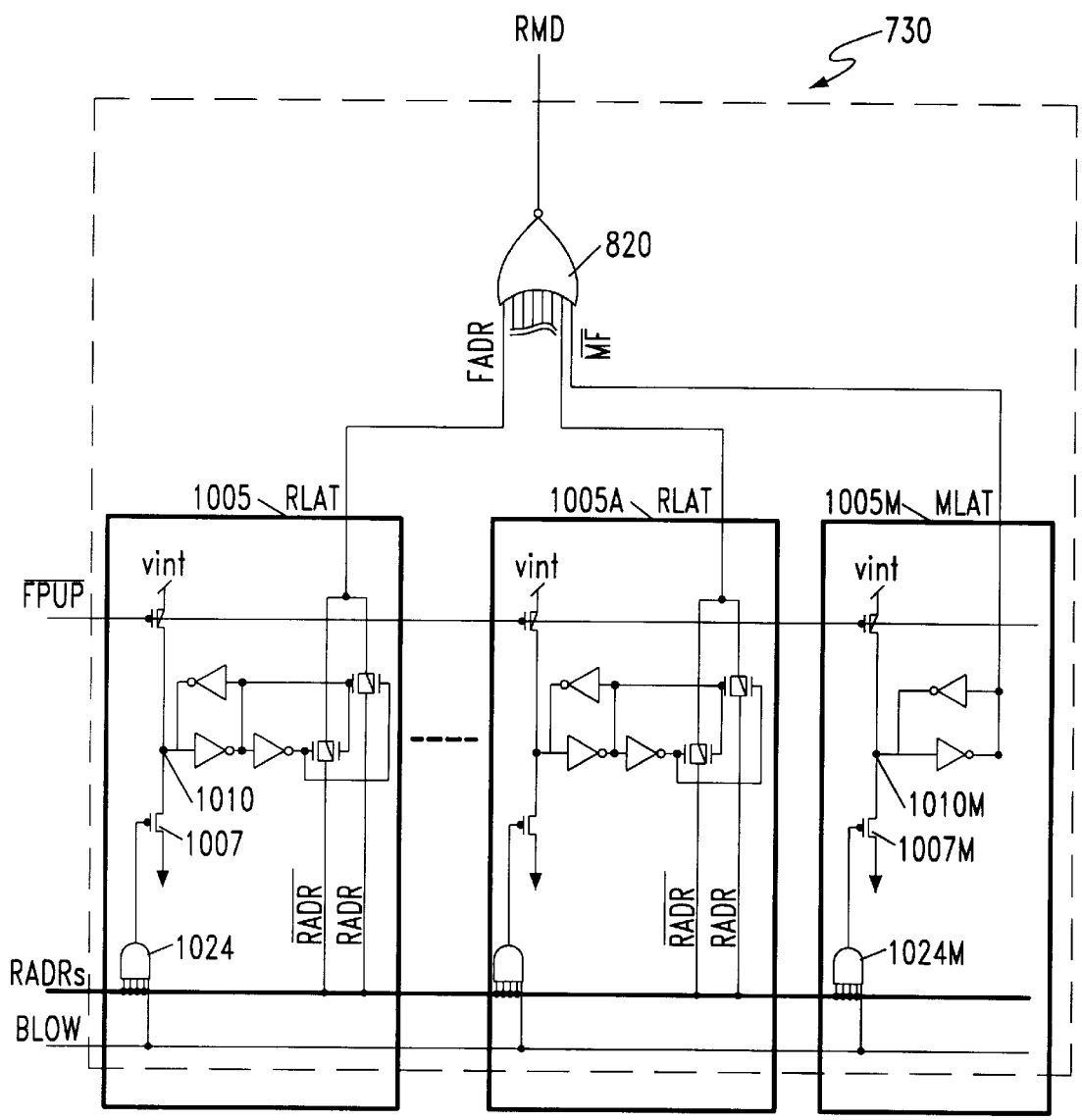
FIG. 10 shows a second preferred embodiment of the invention illustrating a schematic of a transistor representation of a redundancy control circuit having redundancy address latches and decoders.

FIG. 10 is a second preferred embodiment of the invention, showing a detailed schematic of the redundancy control circuit (730). Unlike the first preferred embodiment with e-fuses, both RLAT (1005) and MLAT (1005M) are directly controlled by the RADR bus. Similar to the RLAT (805) and MLAT (805M) in the first embodiment (FIG. 8), nodes 1010 and 1010M are pre-charged to the regulated internal voltage supply (Vint) during the RAM power-on phase. When a redundancy address programming mode is enabled (flow 500) by MRS or EMRS, then the operations: RAM activation, RAM read, RAM, are all disabled. When command $\overline{\text{CS}}$ (i.e., $\overline{\text{CS0}}$) is at low, $\overline{\text{RAS}}$ at low, $\overline{\text{CAS}}$ at high, $\overline{\text{WE}}$ at high is applied, and the row redundancy address write command is enabled. The row address buses (RADRs) are controlled by the RAM address ports, similar to a normal RAM activation mode. The row redundancy address write command also generates a pulsed BLOW. Redundancy address latch decoders (1024) decode signals RADRs when the pulsed BLOW shifts to high, opening the corresponding NMOS (1007). This discharges the corresponding node 1010 to a low level. MLAT (1005M) are also programmed when RLATs (1005) are programmed. This configuration allows the RAM to be dynamically programmed as a fuse-less redundancy replacement.

When RLAT (1005) and MLAT (1005M) are programmed, each RALT (1005) compares the RADR input with the programmed address bit, generating FARD according to truth Table 1. The address match detection operation is the same as that of the first embodiment of the invention, and will not be discussed further. NOR gate (820) decodes the FARDs, generating the redundancy match detection result signal (RMD).

TABLE 1

| ADR | RADR | $\overline{\text{RADR}}$ | Fuse | FADR |
|---|---|---|---|---|
| 0 | 0 | 1 | Exist | 0 |
| 0 | 0 | 1 | Blown (1) | 1 |
| 1 | 1 | 0 | Exist (0) | 1 |
| 1 | 1 | 0 | Blown (1) | 0 |

Figure 11:
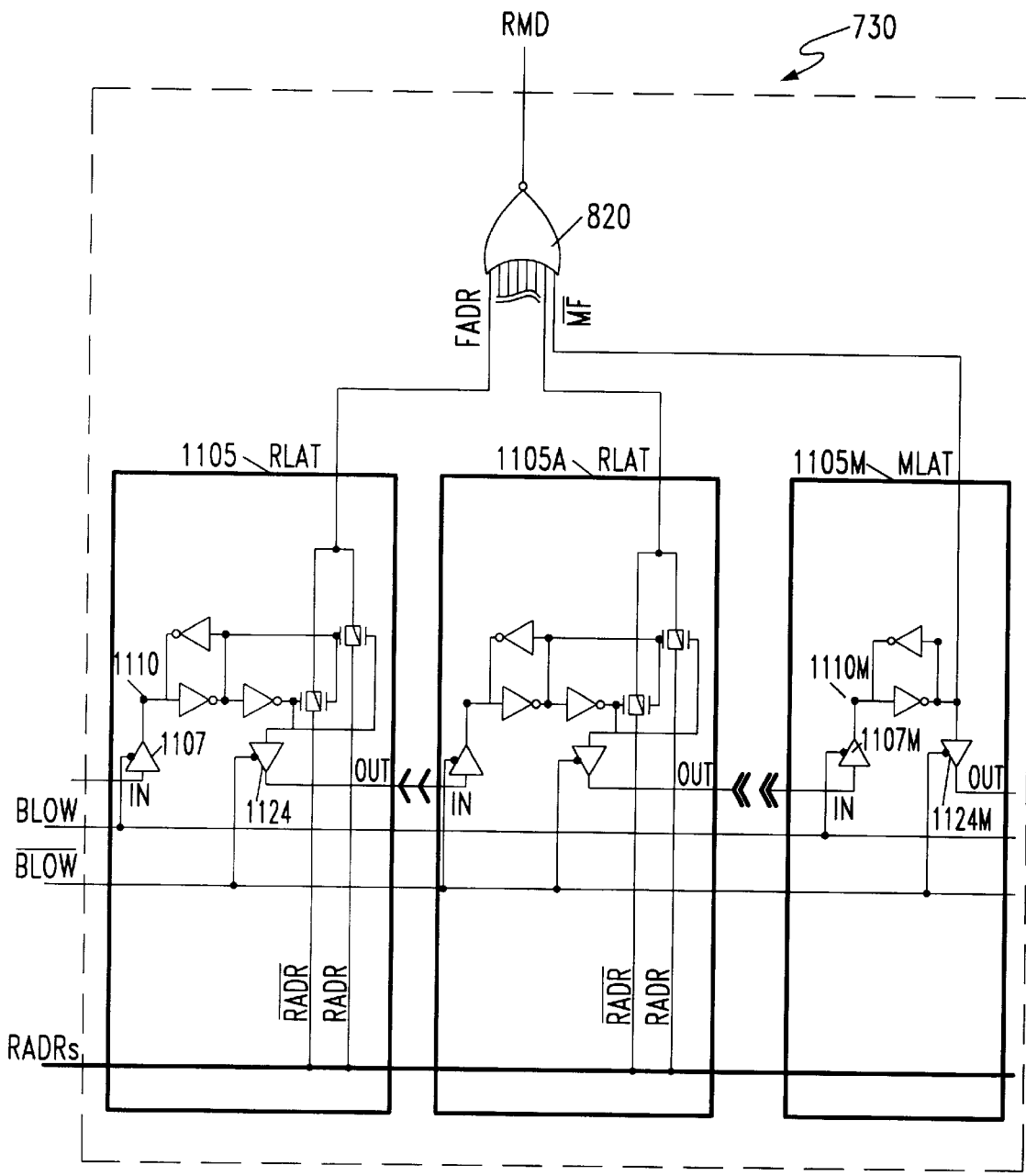
FIG. 11 is a third preferred embodiment of the invention showing a schematic diagram of a transistor level representation of a redundancy control circuit having redundancy address latches and shift register.

FIG. 11 is a third preferred embodiment of the invention, showing a detailed schematic of the redundancy control circuit (730) provided with shift register latches. Each plurality of RLATs (1105) and master latch (MLAT) consists of two tri-state buffers (1107 and 1124 for RLAT, and 1107M and 1124M for MLAT). The output (OUT) of the tri-state buffer (1124) in the previous RLAT (1105) is coupled to the input (IN) of the tri-state buffer (1117) of the following latch. Similarly, the output (OUT) of the tri-state buffer (1124) in the last RLAT is coupled to the input (IN) of the tri-state buffer (1107M) of MLAT (1105M). The output (OUT) of MLAT may be coupled to the input (IN) of the following RLAT for programming other redundancy addresses. Each coupling node (IN and OUT) may have an additional latch to store data during transfer. Tri-state buffers (1107, 1107M) and tri-state buffer (1124, 1124M) are controlled by clocked signal BLOW and $\overline{\text{BLOW}}$, respectively. Thus, by toggling BLOW (with several redundancy address write commands), input data in the first RLAT is serially transferred to the following RLATs and MLAT, allowing programming sequentially the redundancy addresses. The operation of generating a redundancy match detection result signal (RMD) is the same as in the previous two embodiments, and will not be discussed further.

Figure 12:
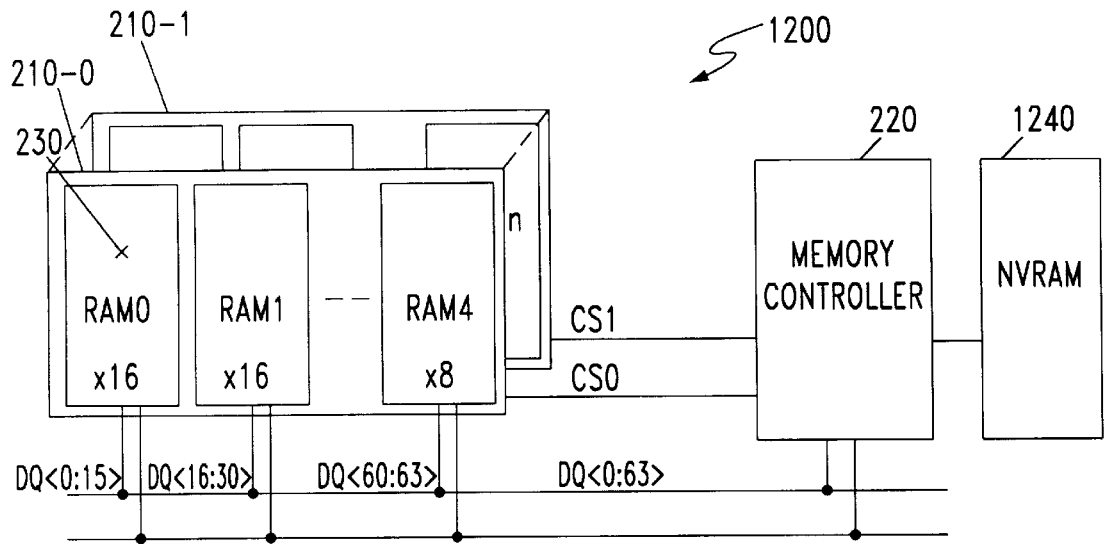
FIG. 12 is a diagram illustrating an electric system consisting of two DIMMs, each containing three ×16 RAMs, two ×8 RAMs and a NVRAM used for RAM identification.

The invention further enables a redundancy address programming for a variety of electric systems by including a non-volatile storage such as a non-volatile memory (NVRAM) or e-fuses. FIG. 12 shows an architecture consisting of two DIMMS (210-0 and 210-1), each consisting of three RAMs, each having 16 data ports (RAM0, RAM1, and RAM3) and two RAMs, each with 8 data ports (RAM3, and RAM4). Numerals 16 and 8 indicate the number of RAM DQ ports (i.e., ×16 DQ ports for RAM0–2, and ×8 DQ ports for RAM4–5). The present invention requires knowing the relationship between the RAM data ports and DIMM data ports that perform the coupling to the system memory data bus (DQ<0:63>). As discussed previously, each RAM is designed such that the least significant RAM DQ port (i.e., the RAM DQ port coupling to the system memory data bus DQ<0> for RAM0) embodies the control port for the redundancy address programming. Thus, memory controller (220) controls DQ<0>, DQ<16>, DQ<32>, DQ<48>, and DQ<56> by selecting RAM0, RAM1, RAM2, RAM3, RAM4, and RAM5, respectively. Alternatively, a data strobe port (DQS) or a data mask port (DQM) may be preferably used for identifying the RAM. NVRAM (1240) stores these RAM data port configurations and, in particular, the corresponding DQ, DQS, or DQ for selecting each RAM. During the power-on phase of the electric system, the RAM data ports are read out from the NVRAM (1240) (or from any non-volatile storage device, such as e-fuses) to the memory controller (220) so that the memory controller (220) can regulate the corresponding system memory data bus (i.e. DQ<0> for selecting RAM0). Optionally, NVRAM data may be read by NVRAM read command after the electric-system power-on, which is well known and which will not be discussed further.

The present invention further provides additional features that allow a RAM adopt a variety of redundancy configurations by storing the RAM redundancy information in the NVRAM (1240) or in the e-fuses. The following discussion defines a domain and redundancy repairability as follows: a domain is an addressable memory space from the predetermined first address to a predetermined second address. The domain have a predetermined redundancy repairability, where faults up to the number of repairable units can be remade within a domain. As an example, RAM0, RAM1, and RAM3 have the first domain and the second domain, each having a repairability of 2. This allows up to two faults to be repaired in each domain. On the other hand, each of RAM4 and RAM5 form a single domain for a repairability of 4, allowing up to 4 faults to be repaired within each RAM. By using this redundancy information (domain and repairability), a microprocessor (not shown) in the electric system can analyze a redundancy address. The analyzed redundancy address can be programmed by the proposed redundancy address programming, for system level repair.

Table 2 summarizes the data to be written into the NVRAM (1240) or in the e-fuses. NVRAM (1240) or the e-fuses may be integrated in the memory controller (220). Alternatively, NVRAM (1240) or e-fuses may be integrated into each RAM (230), or they may be integrated into the memory DIMM.

TABLE 2

| DIMM (CS) | RAM (DQ) | # of redundancy in 1st Domain (ADRs) | # of redundancy in 2nd Domain (ADRs>) |
|---|---|---|---|
| CS0 | 0,16,32 | 2 / ADR<0:FFFF> | 4 / ADR<10000:1FFFF> |
| CS0 | 48,56 | 4 / ADR<0:1FFFF> | None |
| CS1 | 0,16,32 | 2 / ADR<0:FFFF> | 4 / ADR<10000:1FFFF> |
| CS1 | 48,56 | 4 / ADR<0:1FFFF> | None |

Figure 13:
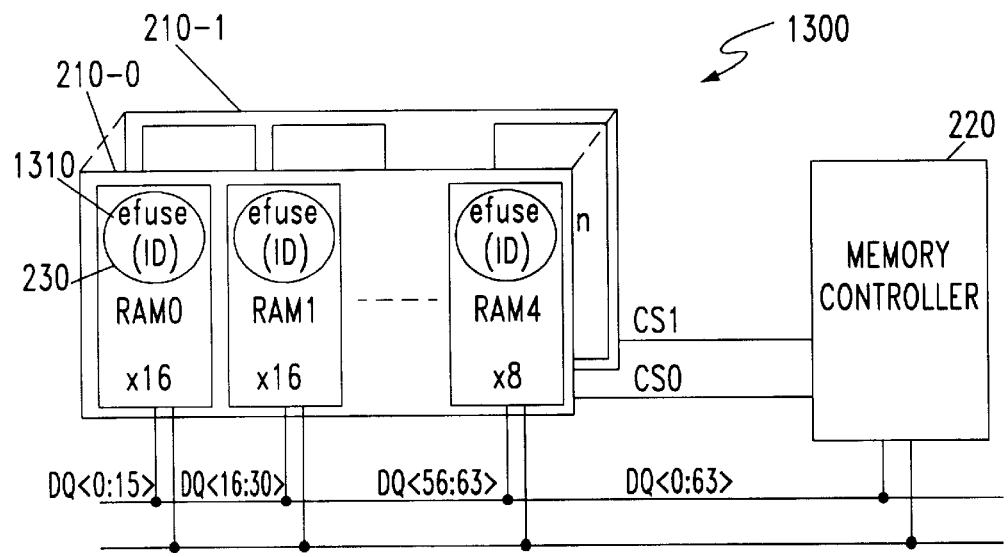
FIG. 13 is a diagram illustrating an electric system consisting of two DIMMs, each containing three ×16 RAMs, two ×8 RAMs, each integrating e-fuses or NVRAM for post-RAM identification.

The invention further enables a post-RAM identification with e-fuses integrated in each RAM. FIG. 13 shows the system architecture, consisting of two DIMMs, each consisting of ×16 RAMs (RAM0, RAM1, and RAM2) and two ×8 RAMs (RAM3 and RAM4). A RAM write command is preferably assigned to enable the function. They are coupled to a memory controller (220) through the system memory bus. For this example, each RAM includes a plurality of e-fuses for post-device identification, where any information such as a customer ID, system information (MPU or peripherals) may be programmed even after that the DIMM or the electric system have been configured. (Note: this information cannot be written during manufacturing). If the RAMs in the electric system can store this information, it can become helpful for debugging field problems effectively. Similar to the redundancy address programming method, the e-fuses in each RAM are also programmed. The programmed information is read-out from the data port of the RAM even if the RAM is decoupled from the electric system. The method to read out the programmed e-fuse data is well described in the aforementioned U.S. patent application Ser. No. 09/512,922, entitled "Method of Addressing Electrical Fuses", filed Feb. 25, 2000.

Figure 14:
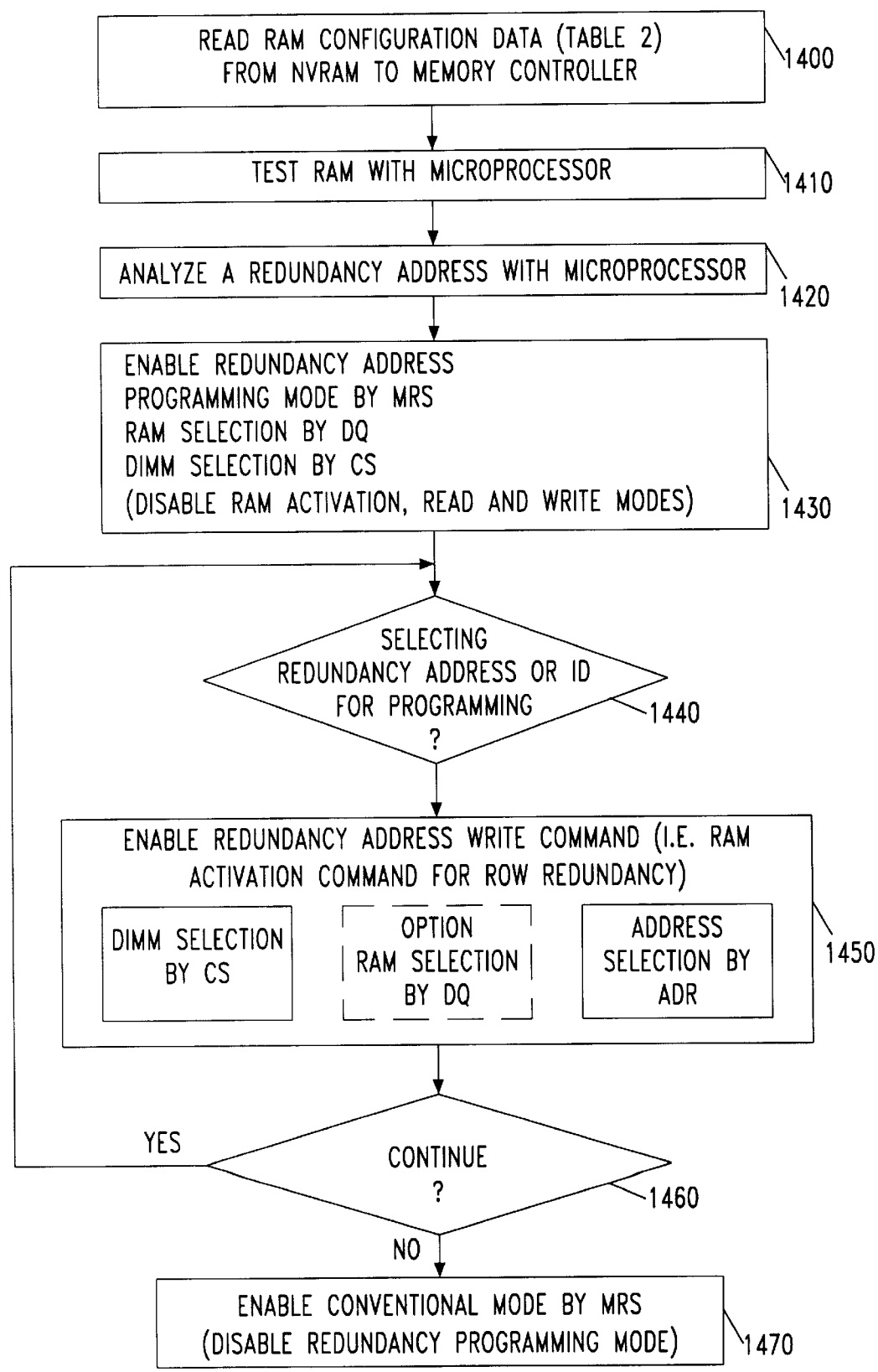
FIG. 14 is a flow chart that summarizes the present invention, and which is applicable to a field repairable electric system consisting of means for testing a RAM, means for analyzing a redundancy address, means for programming a redundancy address, and means for identifying the RAM

FIG. 14 summarizes the flow applicable to a system level repair. When the system is powered on, the memory controller reads the RAM configuration data from NVRAM (1400) or from a non-volatile storage. A microprocessor writes a RAM test vector to the RAM and reads out the vector for testing the RAMs (1410). A RAM test vector such as MARCH can be programmed using appropriate software. The microprocessor must have a working and fully functional memory. The working memory may be an additional RAM or one of the DIMMs which were already tested. The microprocessor, preferably, analyzes test results and calculates a redundancy address (1420). In order to program the redundancy address determined by the microprocessor, the RAM redundancy address programming mode is enabled by setting MRS or EMRS with at least one data port (1430)—a minimal system modification. The redundancy analyzer algorithm can also be flexibly programmed by the software of the electric system. Optionally, a microprocessor determines whether or not the programming is a row redundancy address, a column redundancy address, or a post-RAM identification (1440). The memory controller enables the corresponding write command, where a row redundancy address, column redundancy address, or post ID e-fuse is identified by a RAM read command, a RAM read command, and a RAM write command, respectively (1450). Optionally, the corresponding write command may be enabled by one of the RAM activation command, the RAM write command, the RAM write command, or by any other standard command with predetermined address selection. Further, the RAM can send an acknowledgment signal to the memory controller after verifying that the redundancy address or the ID e-fuses have been programmed. Moreover, the RAM selection may be enabled by at least one data port if the RAM selection may not be applicable by the MRS or EMRS. Blocks 1440 to 1450 are repeated until all the information is programmed (1460). The programming mode is disabled and is returned to another mode by setting other MRS or EMRS (1470).

Although the illustrative embodiments have been described herein with the reference to the accompanying drawings, it is to be understood that the present invention is not limited to those precise embodiments, and that various other changes and modifications may be affected therein by one skilled in the art without departing from the scope of spirit of the invention. By way of example, the present invention describes an electric system configured with discrete components. However, they may be integrated in one or more integrated circuit chips as, for instance, a system-on the chip. The example discussed uses an existing standard SDRAM protocol. Nevertheless, any standard protocol such as Double data rate SDRAM, Rambus DRAM (RDRAM) that share a redundancy address programming is included in the present invention. All such changes and modifications are intended to be within the scope of the invention as defined by the appended claims.

What is claimed is:

1. A semiconductor memory device comprising:
   memory cells and redundancy memory cells arranged in at least one memory array;
   coupled to said at least one memory array, a plurality of control ports, a plurality of address ports and at least one data port;
   a means for replacing defective ones of said memory cells with said redundancy memory cells; and
   a means for programming a redundancy address to identify said defective ones of said memory cells, wherein said means for programming said redundancy address is controlled by a first command detecting a first predetermined condition of said control ports and said data port and by a second command detecting a second predetermined condition of said control ports and identifying a redundancy address with said address ports.

2. A semiconductor memory devices recited in claim 1, wherein said at least one data port is a data mask ports or a data storable port.

3. The semiconductor memory device recited in claim 1, wherein said command ports include a memory select port.

4. The semiconductor memory device recited in claim 3, wherein said first command is a mode register command or an extended mode register command.

5. The semiconductor memory device recited in claim 3, wherein said second command is selected from the group consisting of a memory activation command, a memory read command, a memory write command, and any memory command available for memory access operation.

6. The semiconductor device recited in claim 5, wherein said memory activation command and said memory read command are a row redundancy address write command identifying a row redundancy address and a column redundancy address write command identifying a column redundancy address, respectively.

7. The semiconductor memory device recited in claim 3, wherein said second command is compatible with commands set to access, read, and write into said memory cells.

8. The semiconductor memory device recited in claim 1, wherein said identified redundancy address is determined by electrically programmable fuses.

9. The semiconductor memory device recited in claim 1, wherein said identified redundancy address is determined by redundancy address latches.

10. The semiconductor memory devices recited in claim 9, wherein said redundancy address latches are programmed by a decoding means.

11. The semiconductor memory devices recited in claim 9, wherein said redundancy address latches are programmed by a shift register means.

12. The semiconductor memory devices recited in claim 1, wherein said redundancy address is determined sequentially with at least two phases.

13. An electric system comprising a plurality of memory modules, each of said memory modules comprising a plurality of memory devices, each of said memory devices comprising memory cells and redundancy memory cells arranged in at least one memory array;
   coupled to said at least one memory array, a plurality of control ports, a plurality of address ports and at least one data port;
   a means for replacing defective ones of said memory cells with said redundancy memory cells;
   a means for programming a redundancy address to identify said defective ones of said memory cells;
   said electric system further comprising:
      means for coupling said memory device control ports to corresponding ones of memory module control ports;
      means for coupling said plurality of memory devices address ports to corresponding ones of memory module address ports; and
      means for coupling said at least one of memory devices data port to at least one corresponding memory module data port, wherein said redundancy address of said memory devices in any of said memory modules is programmed by selecting one of said memory module with said at least one module control port decoupled from any other of said memory modules, and by selecting a memory device with said at least one module data port uniquely assigned to each of said memory devices within said selected memory module, and by selecting said redundancy address with said plurality of memory module address ports within said selected memory module.

14. The electric system recited in claim 13, wherein said memory module data ports are memory module data mask ports coupled to corresponding ones of said memory devices data mask ports, or memory module data strobe ports coupled to corresponding ones of memory devices data strobe ports.

15. The electric system recited in claim 13, wherein said at least one module control port is a module select port coupled to a memory select signal in said all memory devices within each memory module.

16. The electric system recited in claim 13, further comprising a memory controller coupling said memory module control ports through a system memory control bus, said memory module address ports through a system memory address bus, and said at least one memory module data port through a system memory data bus, wherein said redundancy address programming means in any of said memory devices in any of said memory modules is controlled by said memory controller through said system memory control bus, through said system memory address bus, and through system memory data bus.

17. The electric system recited in claim 16, further comprising a nonvolatile storage means coupled to said memory controller, wherein said nonvolatile memory storage means stores data information linking said data port in at least one memory devices to said system memory data bus and outputs said data-linked information to said memory controller, wherein said memory controller controls a corresponding one of said system memory data bus to program a redundancy address in said at least one memory device with said data-linked information.

18. The electric system recited in claim 17 further comprising a microprocessor, wherein said microprocessor tests the functionality of said at least one semiconductor memory device by writing and reading a predetermined test vector to and from said at least one semiconductor memory.

19. The electric system recited in claim 18, wherein said microprocessor further comprises a functionally working memory for testing said semiconductor memory.

20. The electric system recited in claim 19, wherein said functionally working memory is one of said semiconductor memories that was previously tested.

21. The electric system recited in claim 18, wherein said predetermined test vector is programmable by software.

22. The electric system recited in claim 21, wherein said predetermined test vector is selected from the group consisting of march, ripple bits, ripple words, and checker board patterns.

23. The electric system recited in claim 18, wherein said nonvolatile storage means stores redundancy information which includes a redundancy domain and repairablity of fails within said redundancy domain.

24. The electric system recited in claim 23, wherein said redundancy domain is bounded by a first address and a second address of said semiconductor memory devices, and said repairability of fails within said semiconductor memory devices is defined by the total number of repairable fails within said bounded domain.

25. The electric system recited in claim 24, wherein said microprocessor analyzes test results of said semiconductor memories, and determines a redundancy address of said sat least one semiconductor memory according to said redundancy information stored in said nonvolatile storage means.

26. The electric system recited in claim 25, wherein said determined redundancy address of said at least semiconductor memory is programmed by said redundancy programming means controlled by said memory controller.

27. A electric system comprising:
   a plurality of semiconductor memory devices, each of said memory devices comprising:

memory cells arranged in at least one memory array;

coupled to said at least one memory array, a plurality of control ports, a plurality of address ports and at least one data port; and a post-device identification storage means controlled with said at least one data port, wherein said at least one data port is coupled to a corresponding system data bus, said post-device identification storage means in any of said semiconductor memory devices is independently programmed by controlling said corresponding system data bus.

28. The electric system recited in claim 27, wherein device identification programmed in said corresponding memory devices is read-out after said semiconductor memory device is disconnected from said electric system.

29. The electric system recited in claim 27, wherein said device identification contains system information which includes microprocessor or peripheral devices information.

30. A method of programming a redundancy address in a semiconductor memory device comprising the steps of:

providing memory cells and redundancy memory cells arranged in at least one memory array;

coupling a plurality of address ports and at least one data port to said at least one memory array a plurality of control ports;

replacing defective ones of said memory cells with said redundancy memory cells; and programming a redundancy address to identify said defective ones of said memory cells, wherein programming said redundancy address is controlled by a first command detecting a first predetermined condition of said control ports and said data port and by a second command detecting a second predetermined condition of said control ports and identifying a redundancy address with said address ports.

31. A method of programming a redundancy address in an electric system, said electric system comprising a plurality of memory modules, each of said memory modules comprising a plurality of memory devices, each of said memory devices comprising memory cells and redundancy memory cells arranged in at least one memory array, the method comprising the steps of:

coupling a plurality of control ports, a plurality of address ports and at least one data port to said at least one memory array;

replacing defective ones of said memory cells with said redundancy memory cells;

programming a redundancy address to identify said defective ones of said memory cells;

said electric system further comprising:

coupling said memory device control ports to corresponding ones of memory module control ports;

coupling said plurality of memory devices address ports to corresponding ones of memory module address ports; and coupling said at least one of memory devices data port to at least one corresponding memory module data port, wherein said redundancy address of said memory devices in any of said memory modules is programmed by selecting one of said memory module with said at least one module control port decoupled from any other of said memory modules, and by selecting a memory device with said at least one module data port uniquely assigned to each of said memory devices within said selected memory module, and by selecting said redundancy address with said plurality of memory module address ports within said selected memory module.

32. A method of programming a redundancy address in an electric system, said electric system comprising a plurality of memory modules, each of said memory modules comprising a plurality of memory devices, each of said memory devices comprising memory cells and redundancy memory cells arranged in at least one memory array, the method comprising the steps of:

coupling a plurality of control ports, a plurality of address ports and at least one data port to said at least one memory array; and providing a post-device identification storage controlled with said at least one data port, wherein said at least one data port is coupled to a corresponding system data bus, said post-device identification storage any of said semiconductor memory devices is independently programmed by controlling said corresponding system data bus.

* * * * *